US010403809B2

(12) United States Patent
Krogstrup et al.

(10) Patent No.: US 10,403,809 B2
(45) Date of Patent: Sep. 3, 2019

(54) MANUFACTURING METHOD FOR A NANOSTRUCTURED DEVICE USING A SHADOW MASK

(71) Applicant: University of Copenhagen, Copenhagen K (DK)

(72) Inventors: Peter Krogstrup, Copenhagen Ø (DK); Charles M. Marcus, Copenhagen Ø (DK)

(73) Assignee: University of Copenhagen (DK)

( * ) Notice: Subject to any disclaimer, the term of this patent is extended or adjusted under 35 U.S.C. 154(b) by 0 days.

(21) Appl. No.: 16/078,837

(22) PCT Filed: Mar. 7, 2017

(86) PCT No.: PCT/EP2017/055291
§ 371 (c)(1),
(2) Date: Aug. 22, 2018

(87) PCT Pub. No.: WO2017/153388
PCT Pub. Date: Sep. 14, 2017

(65) Prior Publication Data
US 2019/0131513 A1  May 2, 2019

(30) Foreign Application Priority Data

Mar. 7, 2016 (EP) ..................... 16158877

(51) Int. Cl.
*H01L 21/00* (2006.01)
*H01L 39/24* (2006.01)
(Continued)

(52) U.S. Cl.
CPC ........ *H01L 39/2493* (2013.01); *C23C 14/042* (2013.01); *C23C 14/28* (2013.01);
(Continued)

(58) Field of Classification Search
CPC ... H01L 39/2493; G06N 10/00; C23C 14/042; C23C 14/28
(Continued)

(56) References Cited

U.S. PATENT DOCUMENTS

| 5,057,485 A | 10/1991 | Nishino et al. |
| 2002/0163079 A1 | 11/2002 | Awano |

(Continued)

FOREIGN PATENT DOCUMENTS

| WO | WO 03/019683 | 3/2003 |
| WO | WO 2007/136412 | 11/2007 |

(Continued)

OTHER PUBLICATIONS

Belzig, W., "Device Physics: Super semiconducting Nanowires," *Nature Nanotechnology*, vol. 1, 2 pages, Dec. 2006.
(Continued)

*Primary Examiner* — David S Blum
(74) *Attorney, Agent, or Firm* — Sunstein Kann Murphy & Timbers LLP

(57) ABSTRACT

The present disclosure relates to a device and method for forming efficient quantum devices, in particular quantum devices that have not been contaminated in ex-situ processes. In particular the presently disclosed method can be applied for manufacturing of a Josephson junction which is an element in a tunable superconducting qubit. One embodiment relates to a method for in-situ production of a barrier/gap in the surface layer(s) of an elongated nanostructure, the method comprising the steps of providing at least one elongated device nanostructure on a substrate in a vacuum chamber having at least one deposition source, providing at least one elongated shadow nanostructure in said vacuum chamber, and depositing at least a first facet layer on at least a part of the device nanostructure(s) and the shadow nano-
(Continued)

structure(s) by means of said deposition source, wherein the deposition source, the device nanostructure and the shadow nanostructure during deposition are arranged such that the shadow nanostructure covers and forms a shadow mask on at least a part of the device nanostructure thereby forming a gap in the first facet layer deposited on the device nanostructure.

21 Claims, 4 Drawing Sheets

(51) Int. Cl.
| | |
|---|---|
| C23C 14/04 | (2006.01) |
| C30B 11/12 | (2006.01) |
| C30B 23/02 | (2006.01) |
| C30B 29/02 | (2006.01) |
| C30B 29/40 | (2006.01) |
| C30B 29/60 | (2006.01) |
| H01L 39/22 | (2006.01) |
| G06N 10/00 | (2019.01) |
| C23C 14/28 | (2006.01) |
| C30B 23/04 | (2006.01) |
| C30B 29/62 | (2006.01) |
| B82Y 40/00 | (2011.01) |

(52) U.S. Cl.
CPC ............. *C30B 11/12* (2013.01); *C30B 23/02* (2013.01); *C30B 23/04* (2013.01); *C30B 29/02* (2013.01); *C30B 29/40* (2013.01); *C30B 29/60* (2013.01); *C30B 29/62* (2013.01); *G06N 10/00* (2019.01); *H01L 39/223* (2013.01); *B82Y 40/00* (2013.01)

(58) Field of Classification Search
USPC .......................................................... 438/2
See application file for complete search history.

(56) References Cited

U.S. PATENT DOCUMENTS

| | | | |
|---|---|---|---|
| 2002/0179937 A1 | 12/2002 | Ivanov et al. | |
| 2003/0042481 A1 | 3/2003 | Tzalenchuk et al. | |
| 2006/0134883 A1 | 6/2006 | Hantschel | |
| 2014/0220340 A1 | 8/2014 | Tucker | |
| 2014/0342236 A1 | 11/2014 | Goyal | |

FOREIGN PATENT DOCUMENTS

| | | |
|---|---|---|
| WO | WO 2008/073529 | 6/2008 |
| WO | WO 2012/119125 | 9/2012 |
| WO | WO 2013/098657 | 7/2013 |
| WO | WO 2014/105569 | 7/2014 |
| WO | WO 2014/165634 | 10/2014 |
| WO | WO 2014/189769 | 11/2014 |
| WO | WO 2015/049349 | 4/2015 |
| WO | WO 2016/000836 | 1/2016 |
| WO | WO 2016/001365 | 1/2016 |
| WO | WO 2016/207415 | 12/2016 |

OTHER PUBLICATIONS

Chang, W., "Superconducting Proximity Effect in InAs Nanowires," *Harvard University*, 192 pages, Jun. 2014.
De Boeck, J., et al., "Hybrid Epitaxial Structures for Spintronics," *Thin Solid Films*, vol. 412, pp. 3-13, 2002.
Dick, K., "Epitaxial Growth and Design of Nanowires and Complex Nanostructures," *Lund University*, Doctoral Thesis, 89 pages, Apr. 2007.
Dowdy, R., et al., "Realization of Unidirectional Planar GaAs Nanowires on GaAs (110) Substrates," *IEEE Electron Device Letters*, vol. 33, No. 4, pp. 522-524, Apr. 2012.
Dowdy, R., et al., "Relationship Between Planar GaAs Nanowire Growth Direction and Substrate Orientation," *Nanotechnology*, vol. 24, No. 3, 6 pages, 2013.
Frolov, S., et al., "Quantum Computing Based on Semiconductor Nanowires," *MRS Bulletin*, vol. 38, pp. 809-815, Oct. 2013.
International Searching Authority Authorized Officer Lekahena, Clifford, International Search Report—International Application No. PCT/EP2016/064787, dated Aug. 22, 2016 together with the Written Opinion of the International Searching Authority, 10 pages.
International Searching Authority, European Patent Office Authorized Officer Delaney, Brigid, International Search Report and Written Opinion, International Appl. No. PCT/EP2015/065110, 15 pages, dated Oct. 14, 2015.
International Searching Authority, European Patent Office Authorized Officer Condron, Millie, International Search Report and Written Opinion, International Application No. PCT/EP2015/054522, 15 pages, dated May 27, 2015.
Krogstrup, P., et al., "Semiconductor—Superconductor Nanowire Epitaxy," *Center for Quantum Devices*, 26 pages, 2014.
Lecocq, F., et al., "Novel E-Beam Lithography Technique for In-Situ Junction Fabrication: The Controlled Undercut," *Nanotechnology*, 6 pages, Jan. 2011.
Leonard, F., et al., "Electrical Contacts to One- and Two-Dimensional Nanomaterials," *Nature Nanotechnology*, vol. 6, pp. 773-783, Dec. 2011.
Mourik, V. et al., "Signatures of Majorana Fermions in Hybrid Superconductor-Semiconductor Nanowire Devices," *Science*, vol. 336, pp. 1003-1007, May 25, 2012.
Nadj-Perge, S., et al., "Spin-orbit qubit in a Semiconductor Nanowire," *Nature*, vol. 468, 11 pages, Dec. 23, 2010.
Petersson, K.D., et al., "Superconducting qubits with Semiconductor Nanowire Josephson Junctions," Abstract Submitted for MAR15 Meeting of *The American Physical Society*, 1 page., 2014.
R. Jin, et al., "Observation of Anomalous Temperature Dependence of the Critical Current in Pb/Sr$_2$RuO$_4$/Pb Junctions," *The American Physical Society—Physical Review B. Condensed Matter*, vol. 59, No. 6, pp. 4433-4438, Feb. 1, 1999.
Roddaro, S., et al., "Hot-Electron Effects in InAs Nanowire Josephson Junctions," *Nano Res.*, vol. 4, No. 3, pp. 259-265, 2011.
Rokhinson, L., et al., "The Fractional a.c. Josephson Effect in a Semiconductor-Superconductor Nanowire as a Signature of Majorana Particles," *Nature Physics*, vol. 8, pp. 795-799, Nov. 2012.
Tian, B., et al., "Three-Dimensional, Flexible Nanoscale Field-Effect Transistors as Localized Bioprobes," *Science*, vol. 329, No. 5993, pp. 830-834, Aug. 13, 2010.
Ungaretti, G., "III-V Semiconductor Nanowires growth and characterization," *Copenhagen University*, Master's Thesis, 67 pages, Aug. 2014.
Watson, J., et al., "Investigation of Semiconductor Nanowires with Shadow-Evaporated Epitaxial Superconducting Shells," Abstract submitted for the MAR16 Meeting of the American Physical Society, 1 page, Nov. 2015.
Xiang, J., et al., "Ge/Si Nanowire Mesoscopic Josephson Junction," *Nature Nanotechnology*, vol. 1, pp. 208-213, Dec. 2006.
Yang, M.H., et al., "Growth of Alkali Halides by Molecular-Beam Epitaxy," *Physical Review B*, vol. 41, No. 12, 14 pages, Apr. 15, 1990.
Ziino, N.L.B., "Analysis of InAs-Nanowires Coated with Al by High-Resolution TEM and Energy Dispersive X-ray Spectroscopy," *Faculty of Science—Univ. of Copenhagen*, 19 pages, Sep. 2, 2012.
Ziino, N.L.B., et al., "Epitaxial Aluminum Contacts to InAs Nanowires," https://arxiv.org/abs/1309.4569, 14 pages, Sep. 18, 2013.
The International Bureau of WIPO Authorized Officer: Nora Lindner, Notification Concerning Transmittal of International Preliminary Report on Patentability; PCT/EP2017/055291, dated Sep. 20, 2018, 9 pages.

MANUFACTURING METHOD FOR A NANOSTRUCTURED DEVICE USING A SHADOW MASK

CROSS REFERENCE TO RELATED APPLICATIONS

This application is a United States national phase application from PCT/EP2017/055291, titled "A MANUFACTURING METHOD FOR A NANOSTRUCTURED DEVICE USING A SHADOW MASK," which has an international filing date of 7 Mar. 2017 and which claims the benefit of European Patent Application No. EP20160158877, filed 7 Mar. 2016, the entire contents of each of which are hereby incorporated by reference herein, for all purposes.

FIELD OF INVENTION

The present disclosure relates to a device and method for forming efficient quantum devices, in particular quantum devices that have not been contaminated in ex-situ processes. In particular the presently disclosed method can be applied for manufacturing of a Josephson junction which is an element in a tunable superconducting qubit.

BACKGROUND OF INVENTION

The fundamental element of a quantum computer is the quantum bit—also known as the "qubit". As opposed to a classical bit, representing zero and one, a qubit is also able to represent a quantum superposition of the two states. Hence, the states can be formalized within the laws of quantum physics, with a probability. Accordingly, the states can be manipulated and observed within the laws of quantum physics.

A number of physical objects have been suggested as potential implementations of qubits. However, solid-state circuits, and superconducting circuits in particular, are of great interest as they offer scalability—a possibility of making circuits with a larger number of interacting qubits. Superconducting qubits are typically based on Josephson junctions (JJ). A Josephson junction is basically two superconductors coupled by a weak link. The weak link can for example be a thin insulating barrier, a short section of non-superconducting metal, or a physical constriction that weakens the superconductivity at the point of contact.

A tunable qubit that overcame the known problems related to tuning a qubit, in particular to tuning the Josephson coupling energy using an external magnetic field was disclosed in WO 2016/000836 where a completely different setup that does not require an external magnetic field for tuning the qubit was presented. In particular WO 2016/000836 disclosed a Josephson junction comprising an elongated hybrid nanostructure comprising superconductor and semiconductor materials and a weak link, wherein the weak link is formed by a semiconductor segment of the elongated hybrid nanostructure and wherein the superconductor material has been removed to provide a semiconductor weak link, i.e. a modification of the typical JJ, being a superconductor-insulator-superconductor (SIS) JJs, to a superconductor-normal-superconductor (SNS) JJ, i.e. by replacing the insulator (I) with a normal element (N), where the normal element is a semiconductor material.

The tunable qubit disclosed in WO 2016/000836 was based on a discovery presented in WO 2016/001365 wherein a nanoscale device (or nanometer scale) comprising an elongated crystalline semiconductor nanostructure, such as a nanowire (crystal) or nanowhisker (crystal) or nanorod (crystal), with epitaxial interfaces between the semiconductor and a metal was disclosed. WO 2016/001365 demonstrated the realization of an almost perfect (epitaxial) interface between a semiconductor and a superconductor in the form of a metal, in particular a hybrid nanostructure with InAs and Al. WO 2016/000836 and WO 2016/001365 are incorporated herein in their entirety.

In WO 2016/000836 the Josephson junction was provided ex-situ by standard lithography technique, e.g. etching the superconducting facet layer(s) of a semiconductor nanowire to provide the gap. One problem with ex-situ processing is impurities and the quantum dot formation and uncontrolled electronic environment that can arise as a result hereof. Another common technique for the fabrication of Josephson junctions involves double-angle shadow evaporation of Al through an offset mask, with the tunnel barrier formed by the diffusive oxidation of the Al base layer. However, these shadow masks are typically masking simple substrate surfaces, thereby only providing simple devices and they typically comprise conventional organic bilayers that are incompatible with the ultra-high vacuum (UHV) environment and the high substrate temperatures required for epitaxial film growth. In order to solve the problem of UHV incompatible shadow masks, complex inorganic shadow masks have been developed to allow for in-situ forming of Josephson junctions in simple devices. However, no known methods exist for forming Josephson junctions in more advanced devices.

SUMMARY OF INVENTION

The present disclosure addresses the above mentioned problems with ex-situ processing by using a nanostructure (e.g. a nanowire) as a shadow mask during deposition of a layer on another nanostructure. In the broadest sense the present disclosure therefore relates to in-situ processing of nanostructures where at least a first nanostructure is used as at least one shadow mask of at least a second nanostructure. This can be used for in-situ fabrication of nanoscale junctions.

In a first aspect the present disclosure relates to a method for in-situ production of a barrier/gap in the surface layer(s) of an elongated nanostructure, the method comprising the steps of providing at least one elongated device nanostructure on a substrate in a vacuum chamber having at least one deposition source, providing at least one elongated shadow nanostructure in said vacuum chamber, and depositing at least a first facet layer on at least a part of the device nanostructure(s) and the shadow nanostructure(s) by means of said deposition source, wherein the deposition source, the device nanostructure and the shadow nanostructure during deposition are arranged such that the shadow nanostructure covers and forms a shadow mask on at least a part of the device nanostructure thereby forming a gap in the first facet layer deposited on the device nanostructure.

But the major advantage is that all process steps can be provided in-situ, because both the device nanostructure(s) and the shadow nanostructure(s) can for example be provided by VLS growing in a vacuum chamber. The end result is that the gap in the facet layer is provided in-situ in the vacuum chamber, i.e. without any ex-situ post processing steps. In particular it means that if the first facet layer is provided in a superconducting material which is deposited on the elongated device nanostructure, a small gap in the superconducting material is provided by the shadow mask formed by the elongated shadow nanostructure. This small gap may consequently constitute a Josephson junction manufactured in-situ that will have the highest possible quality because it is untouched by any top-down ex-situ process, i.e. it is 100% clean. If the device nanostructure is furthermore a semiconductor and the superconductor first facet layer is deposited to provide an epitaxial match between the semiconductor and the superconductor a semiconductor weak link is provided to form a semiconductor based Josephson junction manufactured in-situ that will have the highest possible quality, i.e. it is 100% clean. Using the terms of the disclosure in WO 2016/000836 a Josephson junction can be provided by means of the presently disclosed method. The Josephson junction comprising an elongated hybrid nanostructure comprising superconductor and semiconductor materials and a weak link, wherein the weak link is formed by a semiconductor segment of the elongated hybrid nanostructure wherein the superconductor material has been removed by means of the shadow nanostructure to provide a semiconductor weak link.

DESCRIPTION OF DRAWINGS

FIG. 4A shows just a small part of the many groups of nanowires that can be grown from a single substrate. Hence, the presently disclosed method can be applied to form many junctions in one in-situ growth process where the initial growth positions of the nanowires can be controlled by a lithography defined catalyst pattern.

FIG. 5 contains a table that lists domain matching for InAs with different cubic metals in the [11-2] out-of-plane orientation, according to an embodiment of the present invention.

FIG. 6 contains a table that lists domain matching for InSb with different cubic metals in the [11-2] out-of-plane orientation, according to an embodiment of the present invention.

FIG. 7 contains a table that lists domain matches for GaAs with different cubic metals in the [11-2] out-of-plane orientation, according to an embodiment of the present invention.

DETAILED DESCRIPTION OF THE INVENTION

Figure 1A:
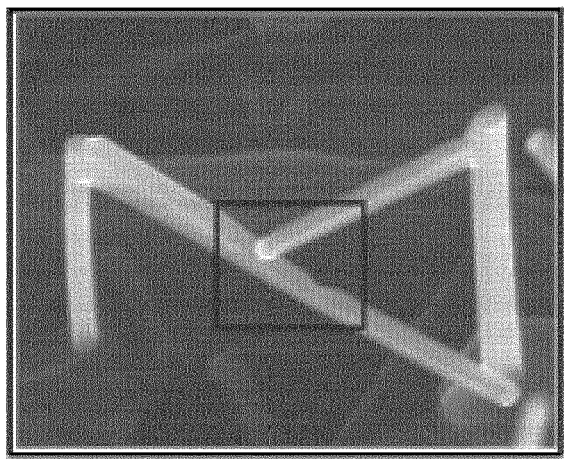
FIG. 1A is a SEM image with an example of a Josephson junction in an epitaxial hybrid nanostructure manufactured in-situ according to the presently disclosed method. The Josephson junction is untouched by any post growth etching process, and the hybrid nanostructure is a result of a fully in-situ process. The Josephson junction has been provided by kinking a shadow nanowire above another kinked device nanowire before deposition of the facet layer. I.e. the two wires have been kinked at different heights such that the top nanowire makes a shadow on the nanowire underneath.
Figure 1B:
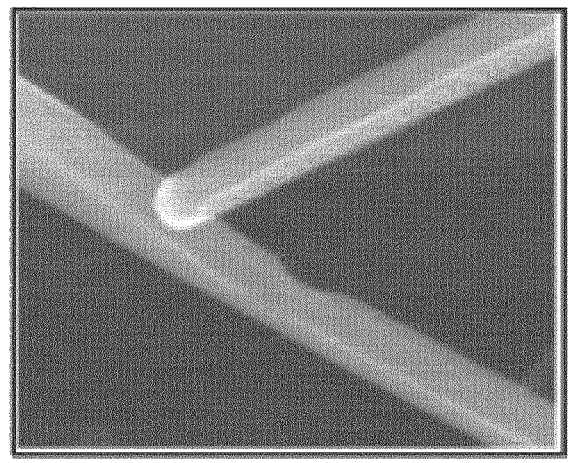
FIG. 1B is a blow-up of the centre of FIG. 1A showing the gap in the surface layer which has been formed by the shadow mask above.
Figure 1C:
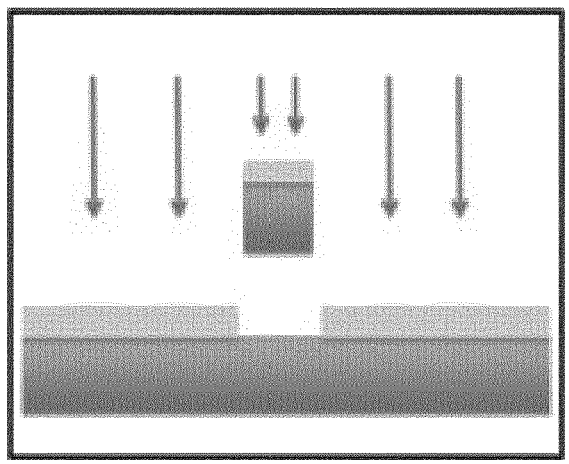
FIG. 1C is a schematic illustration of the presently disclosed principle with an upper lying shadow nanowire acting as shadow mask for a lower lying device nanowire during directional deposition of a surface layer.
Figure 1D:
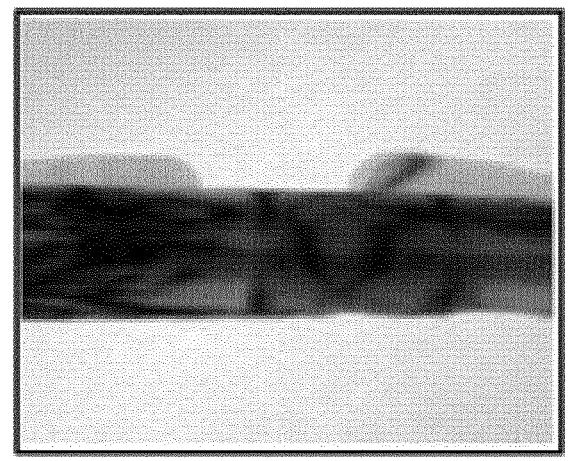
FIG. 1D is a SEM image from the side of the Josephson junction in FIGS. 1A and 1B.

As stated previously the presently disclosed method is directed to in-situ production of a gap in the surface layer(s) of an elongated nanostructure. This gap may form a barrier, e.g. a tunnel barrier, in the surface layer(s) in the longitudinal direction of the elongated nanostructure and may form the basis of a junction. In the case of the surface layer(s) being provided in superconducting material(s) this junction may become a Josephson junction, i.e. under the appropriate conditions. In case of the nanostructure is a semiconductor, the gap in the surface layer(s) can constitute a semiconductor weak link and thereby become a Josephson junction based on a semiconductor-superconductor interface.

The elongated nanostructure may for example be an elongated crystalline (hybrid) nanostructure, for example in the form of a nanowire (crystal) or nanowhisker (crystal) or nanorod (crystal). It may be provided with one or more substantially plane side facets. The terms "nanowire" and "nanowire crystal" may be used interchangeably" herein, as it may be implicitly understood that the nanowires mentioned herein are crystalline structures.

The presently disclosed method applies in principle to one device nanostructure and one shadow nanostructure to provide one junction. However, in practise a large number of junctions can be provided on the same substrate during one process run because a multitude of elongated nanostructures can be grown simultaneously from the same substrate.

In one embodiment the at least one elongated device nanostructure is provided by means of growing said elongated device nanostructure from said substrate. Similarly the at least one elongated shadow nanostructure may be provided by means of growing said elongated shadow nanostructure(s) from said substrate. The shadow nanostructures and the device nanostructures may be the same and may consequently be grown simultaneously in the same growth process. It is then only the position and orientation relative to the direction of the surface layer deposition defines whether the individual nanostructure becomes a device nanostructure or a shadow nanostructure.

The initial growth positions of the device nanostructure(s) and/or the shadow nanostructure(s) on the substrate may be determined by means of one or more catalyst patterns, such as defined on the surface of the substrate prior to the growth process, preferably by means of lithography, growth patterns such as a device nanostructure pattern and a shadow nanostructure pattern. The catalyst pattern can be defined very precisely by means of lithography, possibly also assisted by CAD software. When using VLS growth the catalyst pattern may be defined by metallic catalysts, such as gold droplets/particles, defining ordered positions on the substrate.

The catalyst positions determine the growth positions of the elongated nanostructures. However, the configuration of the single catalyst at least part determines the structure and the corresponding nanostructure, e.g. the thickness/diameter of a nanostructure grown from a catalyst is at least partly determined by the size of the catalyst particle. The inventors have further realized that the growth speed of a nanostructure is depending on the thickness of the nanowire. Hence, the growth speed of a nanowire can at least partly be controlled by the size of the corresponding catalyst particle. The diameter of a nanostructure growing from a catalyst particle roughly corresponds to the diameter of said catalyst particle. This can be utilized to control the vertical positions of shadow nanostructures and device nanostructures relative to each other. Shadow nanostructures can for example be defined by means of catalyst particles that are smaller than the catalyst particles used to define the device nanostructures. The shadow nanostructures will then grow faster than the device nanostructures and if the growth direction of both shadow and device nanostructures is kinked concurrently such that both shadow and device nanostructures grow parallel to the substrate, the shadow nanostructures will then have grown higher before kinking and will after kinking be positioned above the device nanostructures such that they can form shadow masks of the lower lying device nanostructures during deposition of surface layer. Hence, a suitable arrangement of the catalyst pattern prior to growth of the nanostructures can help to align shadow nanowires and device nanowires with respect to each other both in the horizontal and vertical directions.

Alternatively the catalysts can be disposed randomly, which gives nanostructures in random positions. This provides a random distribution of shadow nanostructures, device nanostructures and resulting gaps in the surface layers of the latter. However, due to the large number of nanostructures that can be grown from a substrate in one growth- and deposition process the number of usable junctions resulting thereof may be sufficient.

Nanostructure can also be grown without catalyst. An alternative to controlling the initial growth position is if the nanostructures are grown from holes in an oxide, which is either wet-etched or dry etched in the substrate prior to growth. The latter is also termed selected area growth.

A further embodiment of the presently disclosed method therefore comprises the step of arranging a catalyst pattern in the form of catalyst particles arranged on the substrate defining the initial growth positions of the nanostructures wherein the size and/or diameter and/or volume of the shadow catalyst particles defining at least part of the shadow nanostructures is different, preferably smaller than, the size and/or diameter and/or volume of the device catalyst particles defining at least part of the device nanostructures.

The substrate may for example be a standard substrate with a (111) crystalline orientation. Elongated nanostructures that typically grow in the [111] direction will then grow perpendicular from the substrate. In another embodiment the substrate has a 100-orientation. [111] nanostructures growing from a (100) substrate will grow in oblique angles with respect to the substrate surface. The substrate may be a standard processing wafer, such as a wafer based on $Si/SiO_2$, $Si/BN$, $InAs/SiO_2$, $InAs/BN$ or GaAs.

The recent development within MBE systems and vacuum systems also makes it possible to arrange elongated nanostructures, such as nanowires, in-situ after growth. Hence, initially a multitude of elongated nanostructures are grown from a substrate and clever in-situ arrangement of the nanostructures after growth, e.g. by a micro-robot-in-situ-system provides for that some of the nanostructures can be shadow nanostructures to form shadow masks on device nanostructures during subsequent deposition of one or more surface layers.

The deposition source may be a vapour deposition source as known in the art, and the vacuum chamber and the deposition source may correspondingly be configured to provide a directional beam flux from the deposition source during deposition of one or more surface layers. There may be more than one deposition source, e.g. to provide two or more surface layers of different materials.

In a further embodiment the device nanostructures and shadow nanostructures are arranged such that the shadow mask formed on the first elongated nanostructure during deposition substantially corresponds to the width of the second elongated nanostructure, i.e. corresponding shadow and device nanostructures are arranged substantially perpendicular to each other such that they are crossed in the orientation of the beam flux from the surface layer deposition.

In one embodiment the device nanostructure(s) and the shadow nanostructure(s) are grown from the same plane crystalline surface, e.g. a standard substrate, such as a standard crystalline substrate, i.e. a single-crystal substrate. Elongated nanostructures growing from a substrate preferably have the same or higher symmetry as the substrate, for example along the substrate normal.

In one embodiment the presently disclosed method further comprises the step of kinking the growth direction of the device nanostructure(s) and/or the shadow nanostructure(s) during growth of said nanostructures. If the nanostructures initially are growing substantially parallel, e.g. perpendicular from the substrate surface, a kink in the growth direction, for example such that the kinked nanostructures grow parallel with the plane of the substrate surface, can result in that some of the nanostructures cross each other such that at least one (shadow) nanostructure forms a shadow mask on at least one (device) nanostructure. Kinking the growth direction during growth of an elongated nanostructure is known in the art.

Figure 2A:
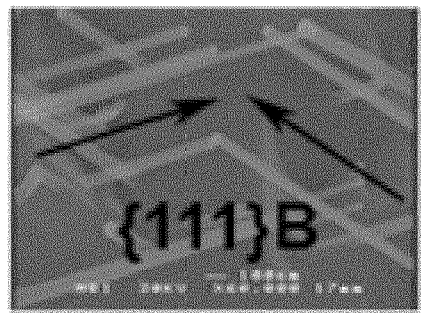
FIG. 2A shows a SEM image of [111]B nanowires grown on a (100) substrate utilizing the tendency of nanowires to grow in the [111]B direction which is not perpendicular to the (100) substrate—the two arrows indicate the two [111]B directions. If a (111) substrate was used the [111]B nanowires would grow perpendicular from the substrate. By using a (100) substrate the [111]B nanowires grow in an oblique angle with respect to the substrate but the two possible [111]B directions are also perpendicular with respect to each such that many of the [111]B nanowires will cross each other.
Figure 2B:
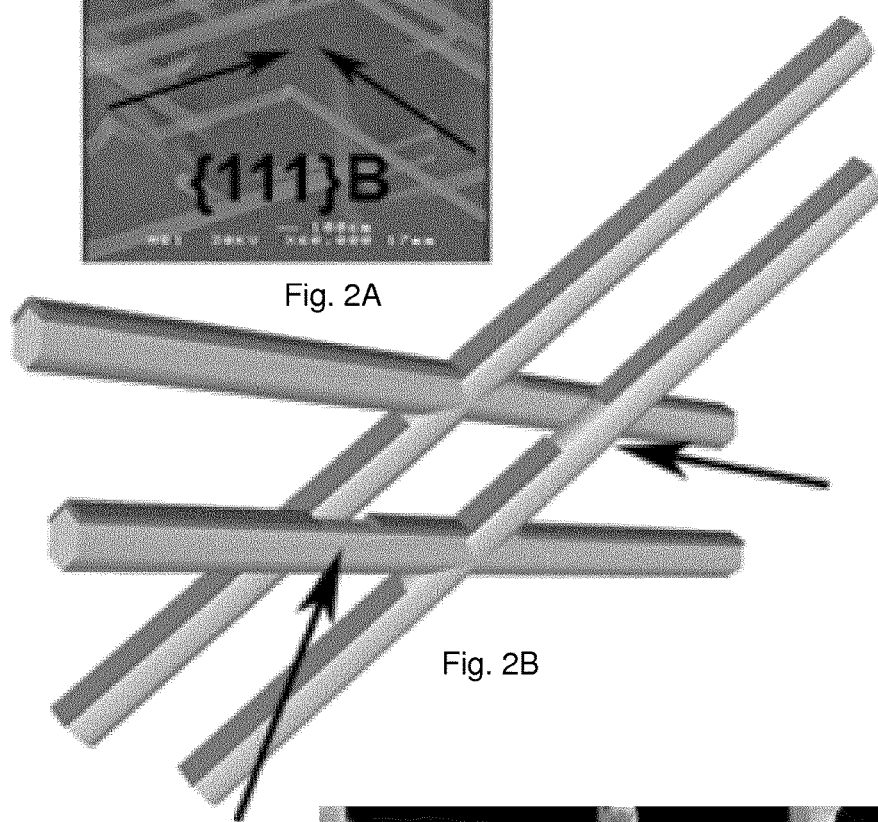
FIG. 2B illustrates four [111]B nanowires in FIG. 2A grown on a (100) substrate. The crossings act as shadow masks during deposition of a surface layer producing two gaps in the deposited surface layer as indicated by the arrows.
Figure 3:
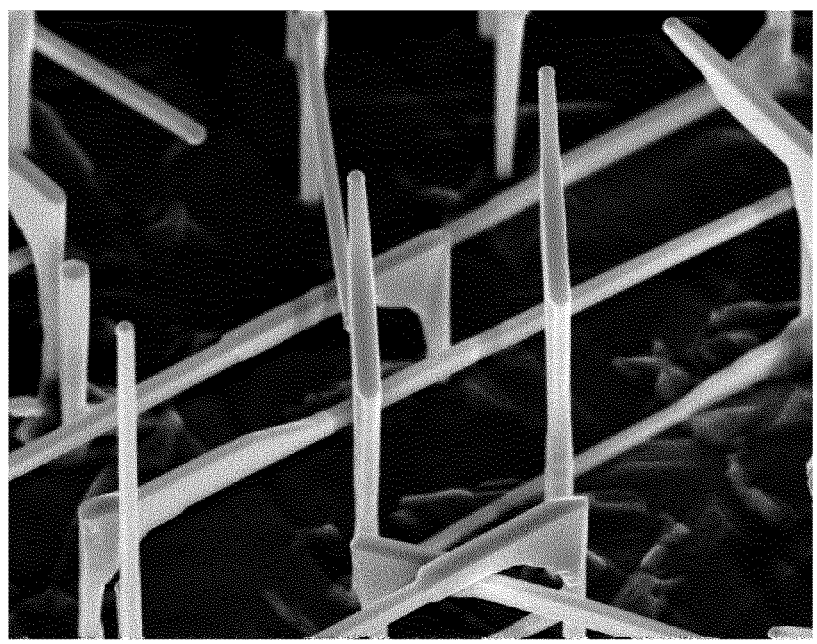
FIG. 3 is a SEM image of kinked nanowires forming upper shadow nanowires and lower device nanowires with gaps in the surface layer.
Figure 4A:
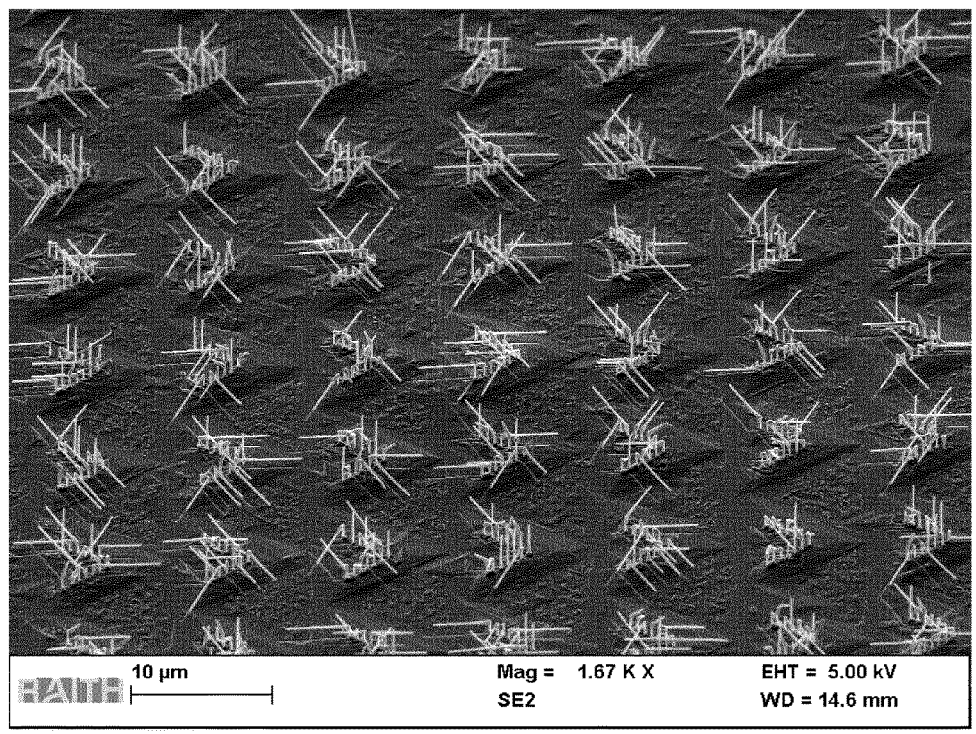
FIG. 4A-C is a series of three SEM images with increasing magnification of InAs nanowires with shadowed junctions in a 30 nm thick epitaxial Al layer along the kinked nanowire that are being shadowed.
Figure 4B:
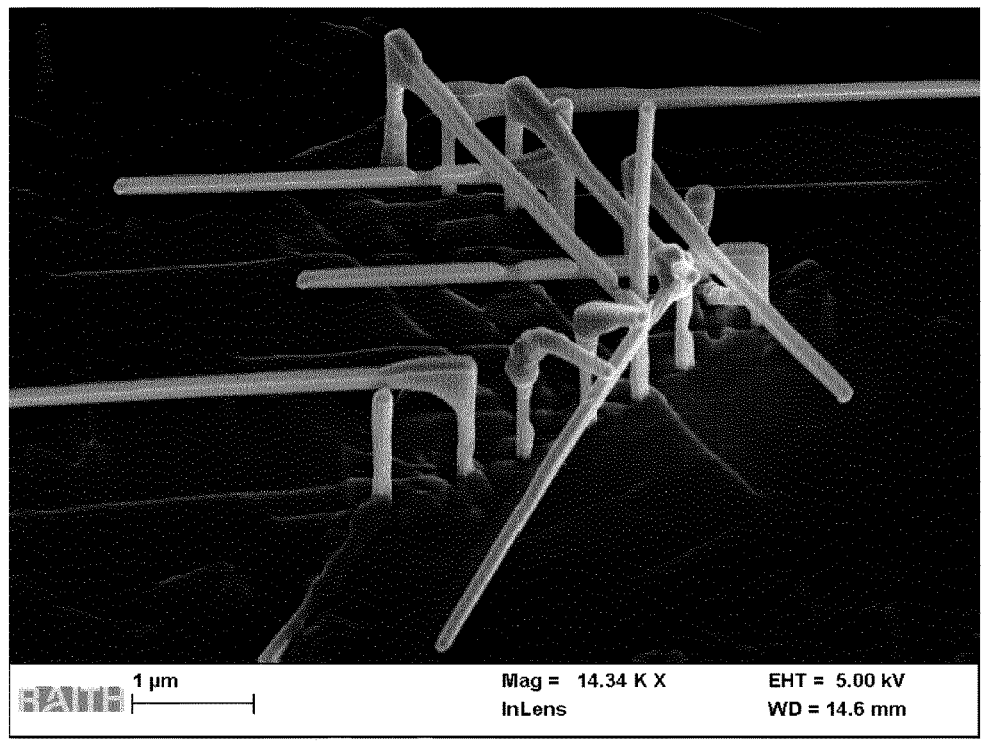
Figure 4C:
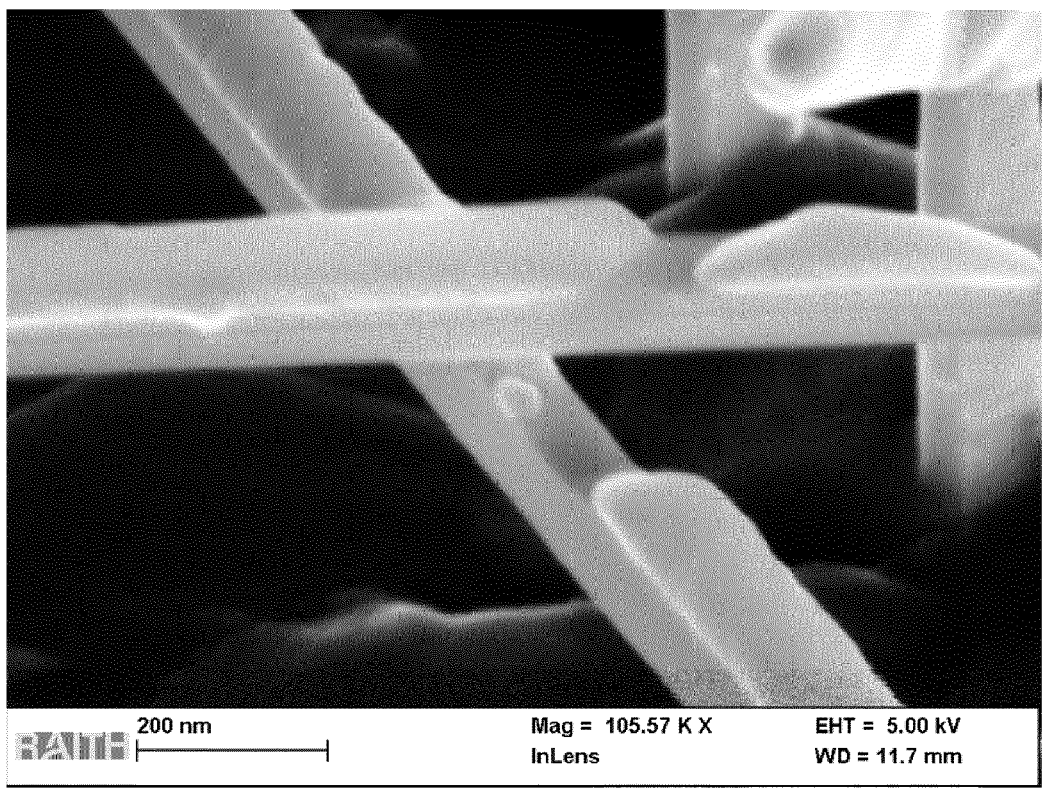

An alternative to kinking the growth direction is to select a substrate where the elongated nanostructures can grow in different directions. E.g. some types of nanowires are known to prefer the [111]b direction and by selecting a (100) substrate as the growth surface, [111]b nanowires will grow in two substantially perpendicular directions such that a plurality of nanowires can cross each other to form shadow nanowires and device nanowires as also exemplified in FIGS. 2A and 2B.

Yet another alternative is to process a plane crystalline substrate such that areas are formed with non-parallel surfaces and/or with different crystalline orientations, e.g. by means of selective etching of the surface. These different areas can be arranged such that elongated nanostructures growing from these areas are growing in non-parallel directions, e.g. towards each other. For example a V-formed valley (groove) can be formed in the surface of the substrate. If elongated nanostructures grow substantially perpendicular from each side of the valley the nanostructures will grow towards each other to form a wire crossing substantially in the middle of the valley. Hence, in a further embodiment at least a part of the device nanostructures are grown from a first surface which is non-parallel but adjacent to a second surface from where a part of the shadow nanostructures are grown, the first and second surfaces arranged such that during growth least one shadow nanostructure grown from the second surface forms a shadow mask on at least one device nanostructure grown from the first surface.

Hybrid Nanostructure

One key aspect when integrating superconductor and semiconductor technology has been the realization of an almost perfect interface between a semiconductor and a superconductor in the form of a metal, in particular a hybrid nanostructure with InAs and Al. Semiconductor/metal (SE/M) interfaces has so far been uncontrolled on the atomic scale. However, nanoscale device (or nanometer scale) comprising an elongated crystalline semiconductor nanostructure, such as a nanowire (crystal) or nanowhisker (crystal) or nanorod (crystal), with epitaxial interfaces between the semiconductor and a metal has been disclosed.

These nanoscale devices have been realized and exemplified by means of bottom-up growth of semiconductor/metal core-shell nanowire crystals by a combination of VLS and molecular beam epitaxy (MBE). One example uses InAs for the nanowire crystal and Al is grown with epitaxially matched single plane interfaces, which can be regarded as the ultimate limit of disorder free contact. Under certain conditions, conventional superconductors can induce a topological non-trivial superconducting state in semiconductor nanowires. Proposals based on proximity effect in semiconductor nanowires with strong spin-orbit are appealing because the key ingredients are known in the art. However, all previous instances of proximitized semiconductors show significant tunneling conductance below the superconducting gap, suggesting a continuum of subgap states that nullifies topological protection—an unsolved issue referred to as the "soft gap problem". Such soft-gaps will induce decoherence of Majorana qubits, and has been considered a major road-block for the future of topological quantum information in such devices. But it turns out that the hardness of the induced superconductivity depends crucially on the quality and uniformity of the semiconductor/superconductor (SE/SU) interfaces. This situation is analogous to that of conventional semiconductor devices where the quality of the involved interfaces is the primary parameter determining the performance. For this reason, semiconductor technology was revolutionized by the invention of epitaxial growth of heterostructures, which enables atomic-scale design of semiconductor interfaces and tailor-made profiles of the electronic band structures, doping levels and strain. So far, however, the world of semiconductor epitaxy has had little to do with the world of superconductivity.

But with the advent of the InAs nanowires with epitaxial Al it has been demonstrated that for temperatures below the superconducting transition temperature aluminum becomes superconducting and the Al shell induces a superconducting gap into the InAs by virtue of the proximity effect. In contrast to all previous studies, however, the induced gap remains hard i.e., free of sub-gap states, likely due to the perfectly uniform InAs/Al interface. The soft-gap problem has therefore been solved, because a hard superconducting gap induced by proximity effect in a semiconductor, is demonstrated by using epitaxial Al—InAs superconductor-semiconductor hybrid nanowires.

The hybrid nanostructures used herein for Josephson junctions are typically superconducting along the longitudinal direction of the nanostructure, e.g. like a superconducting wire, and the weak link to be used in the JJ is created by removing superconducting material from a segment of the hybrid nanostructure by means of a shadow mask defined by shadow nanostructure thereby breaking the superconducting properties in a small segment (the gap in the surface layer(s)) of the nanostructure.

In one embodiment the elongated hybrid nanostructure comprises an elongated crystalline semiconductor nanostructure having at least one substantially plane side facet, and a crystalline superconductor first facet layer deposited on at least one side facet along at least part of the length of the crystalline semiconductor nanostructure, wherein the crystalline structure of the semiconductor nanostructure is epitaxially matched with the crystalline structure of the first facet layer on the interface formed between the semiconductor nanostructure and the crystalline superconductor. The weak link is formed by a semiconductor segment of the elongated hybrid nanostructure where the first facet surface layer has been removed by means of a shadow mask provided during surface layer deposition to provide a semiconductor weak link.

In a further embodiment the elongated hybrid nanostructure comprises an elongated crystalline semiconductor nanostructure having a plurality of substantially plane side facets, and a crystalline superconductor first facet layer covering one or more of said plane side facets of at least part of the length of the crystalline semiconductor nanostructure, wherein the crystalline structure of the semiconductor nanostructure is epitaxially matched with the crystalline structure of the first facet layer on the interface of at least one side facet, and wherein the weak link is formed by a semiconductor segment of the elongated hybrid nanostructure where the first facet layer has been removed by means of a nanostructure shadow mask provided during surface layer deposition to provide a semiconductor weak link.

The elongated crystalline nanostructure may be provided in a semiconducting material, e.g. a semiconducting material selected from the group of III-V combinations, such as InAs, InP, InSb, GaAs, GaSb, AlSb and InGaAs, or group IV elements such as Si or Ge, or II-VI combinations such as ZnO, ZnSe and CdSe, or I-VII combinations. The facet layer may naturally be a metal but may be many types of materials. Further, the facet layer may be provided in a material with superconducting properties below a critical temperature $T_c$. A preferred crystalline semiconductor nanostructure may be InAs, in particular because InAs nanostructures allow for high quality field effect JJs due to the highly transparent Schottky barrier-free SN interface.

The elongated semiconductor nanostructure is crystalline, i.e. it is a single crystal or it is composed of several crystals, e.g. large single crystal elements, forming a crystalline structure. In some embodiments the elongated crystalline nanostructure may be seen as a substantially one-dimensional crystalline structure. It has been demonstrated in InAs with an Al facet layer with Wurtzite(WZ)/FCC or Zinc Blende(ZB)/FCC crystal orientations, which can form uniform crystal morphologies and highly ordered and well defined epitaxial SE/M interfaces between the semiconductor (SE, e.g. InAs) and the metal (M, e.g. Al). However, the epitaxial match can be realized with other material combinations with similar structures and lattice spacings. For relevant FCC metals this could for example be Au and Ag, and for semiconductors this is for example the other members of the '6.1 Å family': GaSb and AlSb. Hence, high quality epitaxial growth of contacts to elongated crystalline nanostructures can therefore be realized with many material combinations.

Having an epitaxial match between the semiconductor and the superconductor has at least one major effect. The superconductor first facet layer forms an atomically precise SN interface leading to a proximity induced gap in the semiconductor nanostructure with a low density of states below the superconducting gap. In other words, the epitaxial match generates a hard gap.

In one embodiment of the invention each two-dimensional interface between a side facet of the elongated crystalline nanostructure and the first facet layer is lattice matched and/or domain matched in at least one dimension, possibly in both dimensions.

Naturally the first facet layer may be crystalline. The two-dimensional interface between a side facet of the crystalline nanostructure and the first facet layer may be epitaxial. Even further the two-dimensional interfaces between each side facet of the crystalline nanostructure and the first facet layer may be epitaxial, such as simultaneously epitaxially matched. Thus, the crystalline structure of the nanostructure may be epitaxially matched with the crystalline structure of the first facet layer. As also stated previously each two-dimensional interface between a side facet of the crystalline nanostructure and the first facet layer may be domain matched and/or lattice matched in at least one dimension, preferably in both dimensions. Thus, in one embodiment each two-dimensional interface between the side facet(s) of the crystalline nanostructure and the first facet layer is simultaneously epitaxially matched, domain matched and lattice matched in both dimensions.

Epitaxial match in the interface between two crystalline layers may not be entirely unusual if the crystal structures of the two crystalline layers are equal. However, it has been demonstrated that an epitaxial interface can be realised even when the crystal structure (and/or crystal phase) of the elongated crystalline nanostructure is different from the crystal structure (and/or crystal phase) of the first facet layer, such as when the crystal structure (and/or crystal phase) of the elongated crystalline nanostructure and the crystal structure (and/or crystal phase) of the first facet layer belong to different lattice systems and/or if the Bravais lattice of the elongated crystalline nanostructure is different from the Bravais lattice of the first facet layer. If for example the crystal structure of the elongated crystalline nanostructure is zincblende (ZB) then the crystal structure of the first facet layer is not zincblende, i.e. the crystal structures are different. Correspondingly if for example the crystal structure of the elongated crystalline nanostructure is wurtzite then the crystal structure of the first facet layer is not wurtzite, i.e. the crystal structures are different. E.g. the crystal structure of the elongated crystalline nanostructure may be zincblende (ZB) or wurtzite (WZ) and the crystal structure of the facet layer belongs to the cubic crystal system, such as primitive cubic, BCC or FCC, as demonstrated herein with InAs nanowires (ZB or WZ) with an Al (FCC) epitaxially matched first facet layer.

In a further embodiment the first facet layer comprises one or more large single crystal segments wherein the interface between the elongated crystalline nanostructure and said single crystal segment(s) is epitaxially matched, such as simultaneously epitaxially matched on all side facets.

The elongated crystalline nanostructure may be homogeneous, i.e. formed from the same compound material in the longitudinal/axial direction and/or in the radial direction. However, the elongated crystalline nanostructure may in itself be a heterogeneous structure, e.g. a heterostructured nanowire crystal. E.g. the crystalline nanostructure may be a heterostructured nanowire crystal composed of different compounds in the axial and/or radial direction.

As previously stated it is unusual that an epitaxial interface is provided between layers having different crystal structures and this opens for epitaxial interfaces between semiconductors (which are often wurtzite or zincblende) and metals (which are often BCC or FCC). In one embodiment the facet layer is hence a metal selected from the group of Al, Ca, Ni, Cu, Kr, Sr, Rh, Pd, Ag, Ce, Yb, Ir, Pt, Au, Pb, Ac, Th, Li, Na, K, V, Cr, Fe, Rb, Nb, Mo, Cs, Ba, Eu, Ta and W. Some of these metals become superconducting below a critical temperature. However, facet layers of other materials may as well be provided where an epitaxial interface to the elongated crystalline nanostructure can be realised, e.g. selected from the group of high temperature ceramic superconductors, such as copper oxide or cuprate superconductors, which are often having a perovskite crystal structure.

The cross-section of the elongated crystalline nanostructure may e.g. be square, hexagonal, or octagonal providing a total of four, six or eight side facets, respectively.

Consequently, the facet layer may be covering at least a part of 1, 2, 3, 4, 5, 6, 7, 8 or more of the side facets.

The thickness of the first facet layer may be less than 300 nm, or less than 250 nm, or less than 200 nm, or less than 150 nm, or less than 100 nm, or less than 90 nm, or less than 80 nm, or less than 70 nm, or less than 60 nm, or less than 50 nm, or less than 45 nm, or less than 40 nm, or less than 35 nm, or less than 30 nm, or less than 25 nm, or less than 20 nm, or less than 19 nm, or less than 18 nm, or less than 17 nm, or less than 16 nm, or less than 15 nm, or less than 14 nm, or less than 13 nm, or less than 12 nm, or less than 11 nm, or less than 10 nm, or less than 9 nm, or less than 8 nm, or less than 7 nm, or less than 6 nm, or less than 5 nm.

At the initial stage of the growth of the first facet layer islands may form at the elongated crystalline nanostructure surface. During this growth the temperature of the substrate may play an important role with regard to the spacing between the islands. If the temperature is low enough, the spacing is so small that the islands will merge at a very thin thickness of the first facet layer. As discussed further below this may lead to surface driven grain growth. A thickness of the first facet layer below 15 nm may only be obtained if the temperature during growth/deposition of the facet layer is below −20° C., or below −25° C., or even below −30° C.

The diameter of the elongated crystalline nanostructure may be between 10 and 200 nm, such as between 10 and 20 nm, or between 20 and 30 nm, or between 30 and 40 nm, or between 40 and 50 nm, or between 50 and 60 nm, or between 60 and 70 nm, or between 70 and 80 nm, or between 80 and 90 nm, or between 90 and 100 nm, or between 100 and 110 nm, or between 110 and 120 nm, or between 120 and 140 nm, or between 140 and 160 nm, or between 160 and 180 nm, or between 180 and 200 nm.

The length of the elongated crystalline nanostructure may be between 1 and 20 µm, or between 1 and 2 µm, or between 2 and 3 µm, or between 3 and 4 µm, or between 4 and 5 µm, or between 5 and 6 µm, or between 6 and 7 µm, or between 7 and 8 µm, or between 8 and 9 µm, or between 9 and 10 µm, or between 10 and 12 µm, or between 12 and 14 µm, or between 14 and 16 µm, or between 16 and 18 µm, or between 18 and 20 µm.

In one embodiment of the present invention, the length of the semiconductor segment is between 10 and 500 nm, or between 20 and 400 nm, or between 40 and 300 nm, more preferably between 100 and 250 nm, most preferably between 150 and 200 nm.

In yet another embodiment of the present invention, the cross-section of the crystalline semiconductor nanostructure is square, thereby providing a total of four side facets or hexagonal, thereby providing a total of six side facets.

In some embodiments of the present invention, the diameter of the crystalline semiconductor nanostructure is between 10 and 200 nm, such as between 10 and 20 nm, or between 20 and 30 nm, or between 30 and 40 nm, or between 40 and 50 nm, or between 50 and 60 nm, or between 60 and 70 nm, or between 70 and 80 nm, or between 80 and 90 nm, or between 90 and 100 nm, or between 100 and 110 nm, or between 110 and 120 nm, or between 120 and 140 nm, or between 140 and 160 nm, or between 160 and 180 nm, or between 180 and 200 nm.

In other embodiments of the present invention, the length of the crystalline semiconductor nanostructure is between 1 and 20 µm, or between 1 and 2 µm, or between 2 and 3 µm, or between 3 and 4 µm, or between 4 and 5 µm, or between 5 and 6 µm, or between 6 and 7 µm, or between 7 and 8 µm, or between 8 and 9 µm, or between 9 and 10 µm, or between 10 and 12 µm, or between 12 and 14 µm, or between 14 and 16 µm, or between 16 and 18 µm, or between 18 and 20 µm.

Kinking

There are several techniques that may cause the growth direction of nanowires to change, i.e. to kink the nanowires during growth. Typical methods arise from changes in the vapor-liquid-solid (VLS) growth condition. The presently disclosed method may as well arise from changes in the vapor-liquid-solid (VLS) growth condition. The kinking itself is well-known, but in combination with the use of some of the nanostructures as shadow masks, a new method and device is provided. Three known methods for kinking the nanowires are described in the following.

Change of crystallographic growth direction (i.e. kinking) may be achieved by changing the incoming fluxes or partial pressures, such that the liquid phase will change in size, which makes the liquid move onto another crystal facet. As an example for the case of III-V nanowires: Turning off the Group V source abruptly will increase the liquid phase volume by an increase in the number group III atoms.

Change of crystallographic growth direction may further be achieved by changing the substrate temperature, such that the liquid phase will change in size due to a change in the thermodynamic driving forces. This can also make the liquid move onto another crystal facet. As an example for the case of III-V nanowires, turning off the Group III material while decreasing temperature will change growth conditions. When increasing the temperature, the wetting conditions will change for another direction.

Change of crystallographic growth direction may also be achieved by introducing a short pulse of different material. The change in composition can change the wetting conditions and promote a new growth direction. As an example, a Gallium (Ga) pulse is introduced to an upwardly growing nanowire, for example a nanowire catalysed by a gold seed. As a consequence, and due to surface kinetics, i.e. in order to minimize interface energies, the gold seed is forced to move to one of the side facets of the upwardly growing nanowire, thereby kinking the nanowire.

In relation to the herein disclosed method, kinking the growth direction of at least a part of the nanostructures is preferably achieved by the change of substrate temperature. However, kinking the growth direction may be by any of the above mentioned methods.

Second Facet Layer

Various types of superconductors have different advantageous properties, such as higher critical temperatures and in particular higher critical magnetic fields, than those offered by aluminum. As a superconductor aluminum has a critical transition temperature Tc of approx. 1.3 Kelvin and a low critical magnetic field Bc. For many applications other superconductors with higher Tc and Bc are desired. For example, niobium has a Tc of ~9 Kelvin and vanadium Tc of ~5 Kelvin; using these elements as superconductors would therefore enable superconducting devices operating above liquid helium temperature (4 Kelvin) making them much more attractive for various superconducting applications. Also, niobium and vanadium has high Bc enabling the operation of superconducting devices in the presence of a sizable (order Tesla) field scale as needed for e.g., topological quantum information with Majorana Fermion bound states. Other superconductors and alloys have even higher Tc and Bc.

However, it can be difficult to find a semiconductor material where an epitaxial match with these other types of superconductors is obtainable. Another ingenious option may then be to use the first facet layer, e.g. in the form of epitaxially matched aluminum, as a coupling layer for interfacing a second facet layer to the hybrid nanostructure, e.g. a second facet layer in the form of another type of material, alloy, or metal that become superconducting below $T_c$. In a further embodiment the presently disclosed method therefore comprises a further step of depositing a second facet layer located on the outside or covering at least a part of the first facet layer. However, the device nanostructure and the shadow nanostructure are still arranged during deposition of said second facet layer such that the shadow nanostructure covers and forms a shadow mask on at least a part of the device nanostructure thereby forming a gap in the second facet layer deposited on the device nanostructure, i.e. the gap is provided in both first and second facet layers.

The first facet layer may have a crystalline structure which is epitaxially matched with the crystalline structure of the nanostructure. In this case the structure of the second facet layer is not necessarily important, i.e. second facet layer may have a crystalline structure which is or is not epitaxially matched with the crystalline structure of the nanostructure. The second facet layer may even have an amorphous structure. But the epitaxial match between the crystalline structures of the semiconductor nanostructure and the first facet layer is preferably configured to induce a superconductor hard gap in the semiconductor nanostructure with the superconducting properties of the second facet layer. That is the main advantage of the second facet layer.

The crystalline nanostructure may be provided in a semiconducting material, the first facet layer may be provided in a first material with superconducting properties below a first critical temperature, and the second facet layer may be provided in a second material with superconducting properties below a second critical temperature.

The material of the second facet layer may be selected among a list of materials that becomes superconducting below a critical temperature and such lists are known in the art, e.g. it may be selected from the group of superconducting ceramic materials, in particular cuprates such as YBCO ($YBa_2Cu_3O_{7-x}$) or superconducting alloys. There are many types of superconducting alloys known in the art and which can be employed here, such as $MgB_2$, niobium alloys such as NiTi and NbTiN with various fractions of Ti and N, and $Zr_{100-x}M$ where x is any number in the range of 0 to 100 and M is a metal selected from the group of Fe, Co, Ni, Cu, Ru, Rh, Pd, Os, Ir, Pt and Au.

The crystalline nanostructure is preferably provided in a semiconducting material, such as selected from the collection of group III-V combinations, such as InAs, InP, InSb, GaAs, GaSb, AlSb and InGaAs, or group IV elements such as Si or Ge, or group IV combinations such as SiGe, or group II-VI combinations such as ZnO, ZnSe and CdSe, or group I-VII combinations.

The main advantage of first and second facet layers solution is that by proximity effect the combined first and second facet layers can effectively appear as a superconductor with the superconducting properties of the second facet layer but with the epitaxial matching properties of the first facet layer. E.g. in the case of an InAs nanowire with an epitaxially matched first facet layer of Al and with a non-epitaxially matched second facet layer of vanadium on top of the first facet layer, the hard gap induced from the Al due to the epitaxial matching between InAs and Al will also be induced from the Vanadium layer by means of the vanadium-aluminum-InAs proximity effect thereby obtaining a superconducting device with a hard gap and a $T_c$ of approx. 5 Kelvin corresponding to the $T_c$ of vanadium. The first facet layer need only have a thickness of a few nanometers whereas the second facet layer can be much thicker. Furthermore, the first+second facet layer approach will work for many types of hybrid nanostructure, e.g. both full-shell and half-shell hybrids. It is furthermore relatively straightforward to make a superconducting contact between the first and the second facet layers, e.g. if using metals.

If the thickness of the first facet layer is much less than the thickness of the second facet layer and also much less than the coherence length in the first facet layer (which e.g. for aluminum is on the order of micrometers) then the resulting combination of the first and second facet layers will appear as a superconductor with Tc and Bc near those of the second facet layer, and at the same time with the epitaxial properties of the first facet layer thereby enabling an induced hard gap in the semiconductor. The thickness of the second facet layer is easy to control and may be from a few nanometers and up to whatever is appropriate for the specific application, e.g. between 5 and 500 nm, or between 10 and 200 nm, or between 20 and 100 nm.

For some compounds making a good contact between the first and second facet layers may be a problem. For example the ceramic high-Tc superconductors need oxygen when deposited as the second facet layer, which will inevitably oxidize the first facet layer in the case of e.g. aluminum. In such cases, adding a thin (approx. 0.3-10 nanometers) layer of an inert materiel, such as gold or another inert metal, such as Platinum, Iridium, Palladium, Osmium, Silver, Rothenium or Rhodium, in order to form a spacer between the first and second facet layers, is desirable in order to protect the surface of the first facet layer. In a further embodiment the presently disclosed method therefore comprises a step of depositing a third facet layer (or intermediate layer or interface layer) located between the first facet layer and the second facet layer. However, the device nanostructure and the shadow nanostructure are still arranged during deposition of said third facet layer such that the shadow nanostructure covers and forms a shadow mask on at least a part of the device nanostructure thereby forming a gap in also the third facet layer deposited on the device nanostructure, i.e. the gap is provided in both first, second and third facet layers.

The third facet layer is preferably an inert material, such as a Noble metal, such as Gold or Platinum or Iridium or Palladium or Osmium or Silver or Rothenium or Rhodium. Further, the thickness of the third facet layer is preferably less than 10 nm, or less than 5 nm, or less than 4 nm, or less than 3 nm, or less than 2 nm, or less than 1 nm, or less than 0.5 nm. In case of e.g. Gold it can be added directly in the MBE or subsequently by evaporation. If the thickness of the third facet layer is thin enough the properties of the triple layers (first, third and second facet layers) will remain dominated by the thicker second facet layer.

Networks

Crossing of elongated nanostructures can also be used to form networks said elongated nanostructures formed by interconnections between said nanostructures if they cross each other in the same plane. Under appropriate growth conditions, the intersecting nanostructures may covalently bond at their intersection and possibly provide epitaxial intersections there between. Hence, these networks can also be formed in-situ along with the junctions. This is also described in pending application EP 15174142 filed 26 Jun. 2015 entitled "Network of nanostructures as grown on a substrate". EP 15174142 is hereby incorporated herein in its entirety.

In a further embodiment the presently disclosed method further therefore comprises the step of forming an interconnected network of at least a part of the device nanostructures. As explained above there are various methods to provide in-situ crossing of the nanostructures, e.g. during or after growth. As exemplified in EP 15174142 the growth direction of the device nanostructures can be kinked during growth such that at least part of the kinked device nanostructures are growing in a network plane parallel to the substrate. One or more network(s) of interconnected kinked device nanostructures can then be created in the network plane, and a dielectric support layer can be provided below the network plane to support said network(s) of interconnected nanostructures. As stated previously kinked shadow nanostructures can then be provided above the device nanostructures in the network plane, e.g. by using smaller catalyst particles for the shadow nanostructures such that they initially grow faster than the device nanostructures.

Networks between device nanostructures can also be formed if at least a first part of the device nanostructures are grown from a first surface which is non-parallel but adjacent to a second surface from where at least a second part of the device nanostructures are grown, the first and second surfaces arranged such that during growth least one device nanostructure grown perpendicular from the second surface forms a connection with a least one device nanostructure grown perpendicular from the first surface.

Growing Nanowires with an Epitaxial Facet Layer

Elongated nanostructures, an in particular elongated crystalline semiconductor nanostructures, may be grown at elevated temperatures, e.g. above 300° C., above 350° C., or above 400° C., e.g. in the normal direction on a plane substrate. Importantly the first facet layer is grown/deposited directly on at least one plane surface of the crystalline semiconductor nanostructure at a much reduced temperature compared to what has previously been tried, e.g. below 50° C. or below 20° C. To provide a thin first facet layer, e.g. on the order of 10 nm, the temperature can be reduced even further, i.e. below 0° C., or below −5° C., or below −10° C., or below −15° C., or below −20° C., or below −25° C., or below −30° C. The reduction in temperature may also help to prevent any material sticking at the semiconductor surface before the first facet layer is deposited. An oxide free interface between the surface of the semiconductor and the first facet layer is thereby obtained, i.e. an oxide free epitaxial interface/contact between a semiconductor nanostructure and a metal/superconductor can be obtained. As demonstrated, nanowires grown in the conventional [0001]$_{WZ}$/[111]$_{ZB}$ direction have a facet layer in the form of a cubic metal phase with the [11-2] normal to the side facets of the nanowire and [111] along the nanowire axis. This is indeed unique because the symmetry allows large single crystal segments with simultaneous epitaxial match on all facets of the nanowire.

As previously demonstrated: If the first facet layer is deposited at very low temperature it is possible to grow a first facet layer such that the two-dimensional interface between the facet layer and the elongated crystalline nanostructure is epitaxially matched, even when the nanostructure and the first facet layer have fundamentally different crystal structures. This opens the door for epitaxial matches between semiconductors and metals on the plane surfaces of hybrid nanostructures, like nanowires. The key issue in the growth method is the low temperature when depositing the first facet layer to provide for initial surface driven growth of small crystal grains of the facet layer. Thus, after the elongated nanostructures have been grown, all sources (e.g. in an MBE chamber) must be shut off such that the growth chamber is empty and then lowering the temperature, which can be lowered to below 0° C. or much lower, within seconds or minutes if external cooling sources like liquid nitrogen is used.

The background pressure may also be reduced before the provision of the first facet layer. If the process takes place in a vacuum chamber, the background pressure may be reduced. This may also help to prevent any material sticking at the nanowire surface before the first facet layer is deposited.

Hence, a hybrid nanostructure may be manufactured in a vacuum chamber by means of vapour liquid solid (VLS) growth and molecular beam epitaxy (MBE), by
a) growing by means of vapour liquid solid (VLS) growth, at an elevated temperature of above 400° C., one or more elongated crystalline nanostructures, such as nanowire (crystals), in the normal direction on a plane substrate,
b) shutting off all sources of growth material and reducing the temperature thereby cooling the substrate with the crystalline nanostructures to a temperature below −30° C., and
c) depositing a crystalline first facet layer directly on at least one plane surface, e.g. a side facet, of the crystalline nanostructures, preferably by means of MBE.

As demonstrated herein a shadow nanostructure can be arranged to provide a gap in this first facet layer.

In order to hit a plane surface, e.g. the side facet(s) of the elongated crystalline nanostructures when growing the first facet layer, the source of the facet layer may be located at a finite angle, e.g. less than 10 deg or less than 5 deg, such as 2-3 degrees, (e.g. inside an MBE vacuum chamber) to the normal direction of the substrate during deposition of the facet layer. In order to cover additional side facets of the elongated crystalline nanostructures the substrate may be rotated during deposition of the facet layer. This rotation may also be provided to ensure that a gap is provided in the first facet layer when a shadow mask is provided.

As also stated previously the temperature of the substrate before deposition of the facet layer may preferably be reduced to a temperature below 10° C., or below 0° C., or below −5° C., or below −10° C. or below −15° C., or below −20° C., such as below −25° C., more preferably below −30° C. These low temperatures have been realized in a standard MBE chamber by reducing the background pressure and waiting for several hours. However, the temperature may be reduced much faster by applying an external source of cooling, e.g. liquid nitrogen, to cool the substrate. Even lower temperatures for depositing/growing the facet layer can then be reached. However, most importantly the time to reach the low temperatures can be much reduced.

Epitaxial Domain Matching for Other Material Combinations

It may be difficult to predict material combinations which will form epitaxial interfaces. For example, surface diffusion lengths of metals on semiconductors are not generally available in the literature, and for a given metal, the large number of possible planes and surface orientations makes it difficult to predict domain matches. However, in the thick shell limit, where strain and grain boundary driven growth dominates, the lowest energy configuration is most likely when the SE and M crystals with similar symmetry groups (ZB or WZ and FCC) orientate along the same type of symmetry classes, especially if the bicrystal match is not to large. For nanowires grown in the conventional $[0001]_{WZ}/[111]_{ZB}$ direction, a cubic metal phase with the $[11\text{-}2]$ normal to the facets and $[111]$ along the nanowire axis is unique in that its symmetry allow large single crystal segments with simultaneous epitaxial match on all facets of the nanowire. Thus, it is natural to expect, that if this orientation matches the semiconductor for a particular metal, it is likely to form in the thick film limit. Thus it is interesting to search among the cubic metals for matches in this orientation. FIGS. 7-9 list the domain strains for a range of metals grown on the important cases of InAs, InSb, and GaAs. In the general notation $$\left(\frac{n_{M,\square}}{n_{SE,\square}}, \varepsilon_{\square}\right) \times \left(\frac{n_{M,\perp}}{n_{SE,\perp}}, \varepsilon_{\perp}\right),$$

we distinguish between interfacial match of interfacial units in the components and the corresponding strain along the length and along the transverse direction to the NW, as expected from relaxed bulk values.

If ZB and FCC orientation along the same type symmetry classes, the two numbers are identical in the parallel and perpendicular directions. FIGS. 7-9 contain suggestions for possible feasible material combinations—combinations without match in the tables may form epitaxial interfaces in other orientations.

Nanoscale Devices

The present disclosure further relates to a nanoscale device manufactured according to the herein disclosed methods. More specifically for example a nanoscale device comprising an elongated device nanostructure having a gap in the surface layer formed by the presently disclosed method, this gap forming a tunnel barrier in the case of superconducting facet layer(s), i.e. a Josephson junction. Hence, the present disclosure further relates to a Josephson junction manufactured in-situ according to the presently disclosed method, e.g. a Josephson junction comprising an elongated hybrid nanostructure comprising superconductor and semiconductor materials and a weak link, wherein the weak link is formed by a semiconductor segment of the elongated hybrid nanostructure wherein the superconductor material has been removed to provide a semiconductor weak link, i.e. equivalent to the semiconductor weak link being formed by a gap in the superconductor material provided by means of a shadow mask formed by an adjacent elongated nanostructure.

In further embodiment the present disclosure further relates to a tunable Josephson device comprising the above mentioned Josephson junction and an electrostatic side gate located adjacent to the weak link of the Josephson junction and configured to apply and control a voltage across the weak link. The electrostatic side gate may be configured to control the electron density in the semiconductor weak link by tuning the voltage of the electrostatic side gate. The electrostatic side gate may further be configured to control the Josephson energy through depletion in the semiconductor weak link by tuning the voltage of the electrostatic side gate.

A further embodiment relates to a side gate controlled charge qubit comprising
 a superconducting island,
 a superconducting electrode,
 a Josephson junction manufactured in-situ according to the presently disclosed method interconnecting the island and the electrode, the Josephson junction comprising a semiconductor weak link and an electrostatic side gate, and
 a main gate voltage coupling the superconducting island and the superconducting electrode by means of a main gate capacitance,
wherein the charge qubit is configured such that the electron density in the semiconductor weak link is controlled by tuning the voltage of the electrostatic side gate.

A further embodiment relates to a side gate controlled transmon qubit comprising
 a superconducting island,
 a superconducting electrode,
 a Josephson junction manufactured in situ according to the presently disclosed method interconnecting the island and the electrode, the Josephson junction comprising a semiconductor weak link and an electrostatic side gate,
 a shunting capacitance shunting the superconducting island to ground, and
 a main gate voltage coupling the superconducting island and the superconducting electrode by means of a main gate capacitance,
wherein the charge qubit is configured such that the electron density in the semiconductor weak link is controlled by tuning the voltage of the electrostatic side gate.

The side gate controlled transmon qubit may be coupled to superconducting transmission line cavity, such as $\lambda/2$, the transmission line cavity may for example have a bare resonance frequency between 1 and 10 GHz, for example approximately 6 GHz. Further, the transmission line may have a quality factor between 1000 and 2000, such as 1500. The cavity may be used for dispersive readout of the qubit with detection, such as homodyne detection.

The invention claimed is:

1. A method for in-situ production of a gap in the surface layer(s) of an elongated nanostructure, the method comprising the steps of
 growing at least two elongated nanostructures from a surface of a substrate such that at least some of the at least two nanostructures grow in non-parallel directions, at least some of the at least two nanostructures being shadow nanostructures and at least some of the at least two nanostructures being device nanostructures, the substrate being located in a vacuum chamber having at least one deposition source, and
 depositing at least a first facet layer on at least a part of each of the at least two nanostructures by means of said deposition source,
 wherein the deposition source and the growth of the at least two nanostructures are arranged such that, during deposition of said at least first facet layer, at least one shadow nanostructure covers and forms a respective shadow mask over a portion of a respective at least one device nanostructure, thereby preventing deposition of the at least first facet layer on the portion of the respective at least one device nanostructure, and thereby collectively forming a respective gap in the first facet layer deposited on each device nanostructure.

2. The method according to claim 1, wherein each of the at least two nanostructures comprises an elongated crystalline semiconductor nanostructure, comprising a plurality of substantially plane side facets, and wherein the at least first facet layer comprises a crystalline structured first facet layer of a superconductor material covering at least a part of one or more of said side facets.

3. The method according to claim 1, wherein the device nanostructures and the shadow nanostructures are arranged such that each respective shadow mask formed over the portion of the respective at least one device nanostructure during deposition substantially corresponds to the width of the respective shadow nanostructure.

4. The method according to claim 1, wherein the device nanostructures and the shadow nanostructures are provided by means of growing said at least two nanostructures simultaneously from said substrate.

5. The method according to claim 1, wherein respective growth positions of the at least two nanostructures on the substrate are determined by means of at least one catalyst pattern.

6. The method according to claim 5, wherein catalyst particles define said at least one catalyst pattern, the at least one catalyst pattern comprises a device nanostructure pattern and a shadow nanostructure pattern, and wherein the catalyst particles that define the shadow nanostructure pattern are different in size from the catalyst particles that define the device nanostructure pattern.

7. The method according to claim 1, wherein the at least one deposition source comprises a vapor deposition source, and wherein the vacuum chamber and the at least one deposition source are configured to provide a directional beam flux from the at least one deposition source during deposition.

8. The method according to claim 1, wherein the device nanostructures and the shadow nanostructures are grown, at least initially, in parallel directions from the same substrate.

9. The method according to claim 1, further comprising the step of kinking the growth direction of the device nanostructures during growth of the device nanostructures and/or kinking the growth direction of the shadow nanostructures during growth of the shadow nanostructures.

10. The method according to claim 1, further comprising the step of forming an interconnected network of at least some of the device nanostructures.

11. The method according to claim 1, wherein the device nanostructures and the shadow nanostructures are grown from the same plane crystalline surface.

12. The method according to claim 1, wherein at least a part of the at least two nanostructures are grown from a first surface of the substrate which is non-parallel and adjacent to a second surface of the substrate from where another part of the at least two nanostructures are grown, the first and second surfaces arranged such that during growth at least one nanostructure grown perpendicular from the first or second surface forms a shadow mask on at least one device nanostructure grown perpendicular from the other surface.

13. The method according to claim 1, wherein at least some of the at least two nanostructures are grown from a crystalline first surface of the substrate and wherein at least a some other of the at least two nanostructures are grown from a crystalline second surface of the substrate, and wherein the crystalline orientation of the first surface is different from the crystalline orientation of the second surface, such that corresponding nanostructures grow in non-parallel directions from said first and second surfaces, respectively.

14. The method according to claim 1, wherein the at least two nanostructures are primarily grown in two non-parallel directions from the same plane crystalline surface, said two nonparallel directions being defined by the crystalline orientations of the substrate and the nanostructures.

15. A nanoscale device comprising a tunnel barrier/Josephson junction formed by the method according to claim 1.

16. The method according to claim 12, wherein the first surface and/or the second surface of the substrate corresponds to a sidewall of a crystalline ridge deposited on the substrate.

17. The method according to claim 2, wherein each elongated crystalline semiconductor nanostructure comprises a nanowire or a nanowhisker or a nanorod.

18. The method according to claim 5, wherein said at least one catalyst pattern is defined on the surface of the substrate by means of lithography.

19. The method according to claim 5, wherein said at least one catalyst pattern comprises a device nanostructure pattern and a shadow nanostructure pattern.

20. The method according to claim 10, wherein the interconnected network is formed by kinking the growth direction of the at least some of the device nanostructures during growth of said device nanostructures.

21. A method for in-situ production of a gap in the surface layer(s) of an elongated nanostructure, the method comprising the steps of providing at least one elongated device nanostructure on a substrate in a vacuum chamber having at least one deposition source, providing at least one elongated shadow nanostructure in said vacuum chamber, and depositing at least a first facet layer on at least a part of each device nanostructure and at least a part of each shadow nanostructure by means of said deposition source, wherein the deposition source, the at least one elongated device nanostructure and the at least one elongated shadow nanostructure during deposition are arranged such that the each shadow nanostructure covers and forms a shadow mask over a portion of a respective at least one of the device nanostructures thereby preventing deposition of the at least first facet layer on the portion of the respective at least one device nanostructure, and thereby collectively forming a gap in the first facet layer deposited on each device nanostructure.

* * * * *

UNITED STATES PATENT AND TRADEMARK OFFICE
CERTIFICATE OF CORRECTION

Page 1 of 4

PATENT NO. : 10,403,809 B2
APPLICATION NO. : 16/078837
DATED : September 3, 2019
INVENTOR(S) : Peter Krogstrup and Charles M. Marcus It is certified that error appears in the above-identified patent and that said Letters Patent is hereby corrected as shown below:

On the Title Page

Under abstract "21 Claims, 4 Drawing Sheets" should read --21 Claims, 7 Drawing Sheets--.

In the Drawings

Add the attached figures 5, 6 and 7.

In the Claims

In Column 18, Line 62 replace "second surface forms a shadow mask on at least one device" with "second surface forms a shadow mask on at least one".

Signed and Sealed this
Twenty-first Day of April, 2020

Andrei Iancu
*Director of the United States Patent and Trademark Office*

| Domain fraction ZB//FCC | Lattice const. | 1/2 0.5 | 1/3 0.333 | 2/3 0.667 | 1/4 0.25 | 3/4 0.75 | 1/5 0.2 | 2/5 0.4 | 3/5 0.6 | 4/5 0.8 |
|---|---|---|---|---|---|---|---|---|---|---|
| FCC metal | | | | | | | | | | |
| Ne | 4.43 | 31.6 | 54.4 | 8.8 | 65.8 | 2.6 | 72.6 | 45.3 | 17.9 | 9.4 |
| Al | 4.05 | 25.2 | 50.1 | 0.3 | 62.6 | 12.2 | 70.1 | 40.2 | 10.2 | 19.7 |
| Ar | 5.26 | 42.4 | 61.6 | 23.2 | 71.2 | 13.6 | 77.0 | 53.9 | 30.9 | 7.9 |
| Ca | 5.58 | 45.7 | 63.8 | 27.6 | 72.9 | 18.6 | 78.3 | 56.6 | 34.9 | 13.1 |
| Ni | 3.52 | 13.9 | 42.6 | 14.7 | 57.0 | 29.1 | 65.6 | 31.2 | 3.3 | 37.7 |
| Cu | 3.61 | 16.1 | 44.1 | 11.9 | 58.0 | 25.9 | 66.4 | 32.9 | 0.7 | 34.3 |
| Kr | 5.72 | 47.0 | 64.7 | 29.4 | 73.5 | 20.6 | 78.8 | 57.6 | 36.5 | 15.3 |
| Sr | 6.08 | 50.2 | 66.8 | 33.6 | 75.1 | 25.3 | 80.1 | 60.1 | 40.2 | 20.3 |
| Rh | 3.8 | 20.3 | 46.9 | 6.3 | 60.1 | 19.6 | 68.1 | 36.2 | 4.3 | 27.5 |
| Pd | 3.89 | 22.1 | 48.1 | 3.8 | 61.1 | 16.8 | 68.9 | 37.7 | 6.6 | 24.6 |
| Ag | 4.09 | 25.9 | 50.6 | 1.3 | 63.0 | 11.1 | 70.4 | 40.8 | 11.1 | 18.5 |
| Xe | 6.2 | 51.1 | 67.4 | 34.9 | 75.6 | 26.7 | 80.5 | 60.9 | 41.4 | 21.8 |
| Ce | 5.16 | 41.3 | 60.9 | 21.7 | 70.6 | 11.9 | 76.5 | 53.0 | 29.6 | 6.1 |
| Yb | 5.49 | 44.8 | 63.2 | 26.4 | 72.4 | 17.2 | 77.9 | 55.9 | 33.8 | 11.7 |
| Ir | 3.84 | 21.1 | 47.4 | 5.2 | 60.6 | 18.3 | 68.4 | 36.9 | 5.3 | 26.2 |
| Pt | 3.92 | 22.7 | 48.5 | 3.0 | 61.4 | 15.9 | 69.1 | 38.2 | 7.3 | 23.6 |
| Au | 4.08 | 25.8 | 50.5 | 1.0 | 62.9 | 11.4 | 70.3 | 40.6 | 10.9 | 18.8 |
| Pb | 4.95 | 38.8 | 59.2 | 18.4 | 69.4 | 8.2 | 75.5 | 51.0 | 26.6 | 2.1 |
| Ac | 5.31 | 43.0 | 62.0 | 23.9 | 71.5 | 14.4 | 77.2 | 54.4 | 31.5 | 8.7 |
| Th | 5.08 | 40.4 | 60.2 | 20.5 | 70.2 | 10.6 | 76.1 | 52.3 | 28.4 | 4.6 |
| ZB//BCC | | | | | | | | | | |
| Li | 3.49 | 13.2 | 42.1 | 15.7 | 56.6 | 30.2 | 65.3 | 30.6 | 4.2 | 38.9 |
| Na | 4.23 | 28.4 | 52.3 | 4.5 | 64.2 | 7.4 | 71.4 | 42.7 | 14.1 | 14.6 |
| K | 5.23 | 42.1 | 61.4 | 22.8 | 71.0 | 13.1 | 76.8 | 53.7 | 30.5 | 7.3 |
| V | 3.02 | 0.3 | 33.1 | 33.7 | 49.8 | 50.5 | 59.9 | 19.8 | 20.4 | 60.5 |
| Cr | 2.88 | 5.2 | 29.9 | 40.2 | 47.4 | 57.8 | 57.9 | 15.9 | 26.2 | 68.3 |
| Fe | 2.87 | 5.5 | 29.6 | 40.7 | 47.2 | 58.3 | 57.8 | 15.6 | 26.7 | 68.9 |
| Rb | 5.59 | 45.8 | 63.9 | 27.7 | 72.9 | 18.7 | 78.3 | 56.6 | 35.0 | 13.3 |
| Nb | 3.3 | 8.2 | 38.8 | 22.4 | 54.1 | 37.7 | 63.3 | 26.6 | 10.2 | 46.9 |
| Mo | 3.15 | 3.8 | 35.9 | 28.2 | 51.9 | 44.2 | 61.5 | 23.1 | 15.4 | 53.9 |
| Cs | 6.05 | 49.9 | 66.6 | 33.2 | 75.0 | 24.9 | 80.0 | 59.9 | 39.9 | 19.9 |
| Ba | 5.02 | 39.7 | 59.8 | 19.5 | 69.8 | 9.5 | 75.9 | 51.7 | 27.6 | 3.5 |
| Eu | 4.61 | 34.3 | 56.2 | 12.4 | 67.1 | 1.4 | 73.7 | 47.4 | 21.2 | 5.1 |
| Ta | 3.31 | 8.5 | 39.0 | 22.0 | 54.2 | 37.3 | 63.4 | 26.8 | 9.8 | 46.4 |
| W | 3.16 | 4.1 | 36.1 | 27.8 | 52.1 | 43.8 | 61.7 | 23.3 | 15.0 | 53.4 |

*Fig. 5*

| Domain fraction | | 1/2 | 1/3 | 2/3 | 1/4 | 3/4 | 1/5 | 2/5 | 3/5 | 4/5 |
|---|---|---|---|---|---|---|---|---|---|---|
| fcc metal | lattice const | 0.5 | 0.333 | 0.667 | 0.25 | 0.75 | 0.2 | 0.4 | 0.6 | 0.8 |
| Ne | 4.43 | 26.9 | 51.2 | 2.5 | 63.4 | 9.7 | 70.7 | 41.5 | 12.2 | 17.0 |
| Al | 4.05 | 20.0 | 46.7 | 6.7 | 60.0 | 20.0 | 68.0 | 36.0 | 4.0 | 28.0 |
| Ar | 5.26 | 38.4 | 58.9 | 17.9 | 69.2 | 7.6 | 75.4 | 50.7 | 26.1 | 1.5 |
| Ca | 5.58 | 41.9 | 61.3 | 22.6 | 71.0 | 12.9 | 76.8 | 53.6 | 30.3 | 7.1 |
| Ni | 3.52 | 8.0 | 38.6 | 22.7 | 54.0 | 38.0 | 63.2 | 26.4 | 10.4 | 47.3 |
| Cu | 3.61 | 10.3 | 40.2 | 19.6 | 55.1 | 34.6 | 64.1 | 28.2 | 7.7 | 43.6 |
| Kr | 5.72 | 43.4 | 62.2 | 24.5 | 71.7 | 15.0 | 77.3 | 54.7 | 32.0 | 9.4 |
| Sr | 6.08 | 46.7 | 64.5 | 29.0 | 73.4 | 20.1 | 78.7 | 57.4 | 36.1 | 14.8 |
| Rh | 3.8 | 14.8 | 43.2 | 13.7 | 57.4 | 27.9 | 65.9 | 31.8 | 2.3 | 36.4 |
| Pd | 3.89 | 16.7 | 44.5 | 11.0 | 58.4 | 24.9 | 66.7 | 33.4 | 0.1 | 33.2 |
| Ag | 4.09 | 20.8 | 47.2 | 5.6 | 60.4 | 18.8 | 68.3 | 36.6 | 5.0 | 26.7 |
| Xe | 6.2 | 47.8 | 65.2 | 30.3 | 73.9 | 21.6 | 79.1 | 58.2 | 37.3 | 16.4 |
| Ce | 5.16 | 37.2 | 58.1 | 16.3 | 68.6 | 5.8 | 74.9 | 49.8 | 24.7 | 0.4 |
| Yb | 5.49 | 41.0 | 60.7 | 21.3 | 70.5 | 11.5 | 76.4 | 52.8 | 29.2 | 5.6 |
| Ir | 3.84 | 15.6 | 43.8 | 12.5 | 57.8 | 26.5 | 66.3 | 32.5 | 1.2 | 35.0 |
| Pt | 3.92 | 17.4 | 44.9 | 10.2 | 58.7 | 24.0 | 66.9 | 33.9 | 0.8 | 32.2 |
| Au | 4.08 | 20.6 | 47.1 | 5.9 | 60.3 | 19.1 | 68.2 | 36.5 | 4.7 | 27.0 |
| Pb | 4.95 | 34.6 | 56.4 | 12.7 | 67.3 | 1.8 | 73.8 | 47.6 | 21.5 | 4.7 |
| Ac | 5.31 | 39.0 | 59.3 | 18.7 | 69.5 | 8.5 | 75.6 | 51.2 | 26.8 | 2.4 |
| Th | 5.08 | 36.2 | 57.5 | 15.0 | 68.1 | 4.3 | 74.5 | 49.0 | 23.5 | 2.0 |
| BCC | | | | | | | | | | |
| Li | 3.49 | 7.2 | 38.1 | 23.8 | 53.6 | 39.2 | 62.9 | 25.7 | 11.4 | 48.5 |
| Na | 4.23 | 23.4 | 48.9 | 2.1 | 61.7 | 14.9 | 69.4 | 38.7 | 8.1 | 22.5 |
| K | 5.23 | 38.1 | 58.7 | 17.4 | 69.0 | 7.1 | 75.2 | 50.4 | 25.7 | 0.9 |
| V | 3.02 | 7.3 | 28.5 | 43.0 | 46.4 | 60.9 | 57.1 | 14.2 | 28.7 | 71.6 |
| Cr | 2.88 | 12.5 | 25.0 | 50.0 | 43.8 | 68.7 | 55.0 | 10.0 | 35.0 | 80.0 |
| Fe | 2.87 | 12.9 | 24.8 | 50.5 | 43.6 | 69.3 | 54.9 | 9.7 | 35.4 | 80.6 |
| Rb | 5.59 | 42.0 | 61.4 | 22.7 | 71.0 | 13.1 | 76.8 | 53.6 | 30.5 | 7.3 |
| Nb | 3.3 | 1.8 | 34.6 | 30.9 | 50.9 | 47.3 | 60.7 | 21.5 | 17.8 | 57.1 |
| Mo | 3.15 | 2.8 | 31.4 | 37.1 | 48.6 | 54.3 | 58.9 | 17.7 | 23.4 | 64.5 |
| Cs | 6.05 | 46.5 | 64.3 | 28.6 | 73.2 | 19.7 | 78.6 | 57.2 | 35.7 | 14.3 |
| Ba | 5.02 | 35.5 | 57.0 | 14.0 | 67.7 | 3.2 | 74.2 | 48.4 | 22.6 | 3.3 |
| Eu | 4.61 | 29.7 | 53.2 | 6.3 | 64.9 | 5.4 | 71.9 | 43.8 | 15.7 | 12.4 |
| Ta | 3.31 | 2.1 | 34.8 | 30.5 | 51.1 | 46.8 | 60.9 | 21.7 | 17.4 | 56.6 |
| W | 3.16 | 2.5 | 31.7 | 36.7 | 48.7 | 53.8 | 59.0 | 18.0 | 23.0 | 64.0 |

*Fig. 6*

| Domain fraction | | 1/2 | 1/3 | 2/3 | 1/4 | 3/4 | 1/5 | 2/5 | 3/5 | 4/5 |
|---|---|---|---|---|---|---|---|---|---|---|
| fcc metal | lattice const | 0.5 | 0.333 | 0.667 | 0.25 | 0.75 | 0.2 | 0.4 | 0.6 | 0.8 |
| Ne | 4.43 | 26.9 | 51.2 | 2.5 | 63.4 | 9.7 | 70.7 | 41.5 | 12.2 | 17.0 |
| Al | 4.05 | 20.0 | 46.7 | 6.7 | 60.0 | 20.0 | 68.0 | 36.0 | 4.0 | 28.0 |
| Ar | 5.26 | 38.4 | 58.9 | 17.9 | 69.2 | 7.6 | 75.4 | 50.7 | 26.1 | 1.5 |
| Ca | 5.58 | 41.9 | 61.3 | 22.6 | 71.0 | 12.9 | 76.8 | 53.6 | 30.3 | 7.1 |
| Ni | 3.52 | 8.0 | 38.6 | 22.7 | 54.0 | 38.0 | 63.2 | 26.4 | 10.4 | 47.3 |
| Cu | 3.61 | 10.3 | 40.2 | 19.6 | 55.1 | 34.6 | 64.1 | 28.2 | 7.7 | 43.6 |
| Kr | 5.72 | 43.4 | 62.2 | 24.5 | 71.7 | 15.0 | 77.3 | 54.7 | 32.0 | 9.4 |
| Sr | 6.08 | 46.7 | 64.5 | 29.0 | 73.4 | 20.1 | 78.7 | 57.4 | 36.1 | 14.8 |
| Rh | 3.8 | 14.8 | 43.2 | 13.7 | 57.4 | 27.9 | 65.9 | 31.8 | 2.3 | 36.4 |
| Pd | 3.89 | 16.7 | 44.5 | 11.0 | 58.4 | 24.9 | 66.7 | 33.4 | 0.1 | 33.2 |
| Ag | 4.09 | 20.8 | 47.2 | 5.6 | 60.4 | 18.8 | 68.3 | 36.6 | 5.0 | 26.7 |
| Xe | 6.2 | 47.8 | 65.2 | 30.3 | 73.9 | 21.6 | 79.1 | 58.2 | 37.3 | 16.4 |
| Ce | 5.16 | 37.2 | 58.1 | 16.3 | 68.6 | 5.8 | 74.9 | 49.8 | 24.7 | 0.4 |
| Yb | 5.49 | 41.0 | 60.7 | 21.3 | 70.5 | 11.5 | 76.4 | 52.8 | 29.2 | 5.6 |
| Ir | 3.84 | 15.6 | 43.8 | 12.5 | 57.8 | 26.5 | 66.3 | 32.5 | 1.2 | 35.0 |
| Pt | 3.92 | 17.4 | 44.9 | 10.2 | 58.7 | 24.0 | 66.9 | 33.9 | 0.8 | 32.2 |
| Au | 4.08 | 20.6 | 47.1 | 5.9 | 60.3 | 19.1 | 68.2 | 36.5 | 4.7 | 27.0 |
| Pb | 4.95 | 34.6 | 56.4 | 12.7 | 67.3 | 1.8 | 73.8 | 47.6 | 21.5 | 4.7 |
| Ac | 5.31 | 39.0 | 59.3 | 18.7 | 69.5 | 8.5 | 75.6 | 51.2 | 26.8 | 2.4 |
| Th | 5.08 | 36.2 | 57.5 | 15.0 | 68.1 | 4.3 | 74.5 | 49.0 | 23.5 | 2.0 |
| BCC | | | | | | | | | | |
| Li | 3.49 | 7.2 | 38.1 | 23.8 | 53.6 | 39.2 | 62.9 | 25.7 | 11.4 | 48.5 |
| Na | 4.23 | 23.4 | 48.9 | 2.1 | 61.7 | 14.9 | 69.4 | 38.7 | 8.1 | 22.5 |
| K | 5.23 | 38.1 | 58.7 | 17.4 | 69.0 | 7.1 | 75.2 | 50.4 | 25.7 | 0.9 |
| V | 3.02 | 7.3 | 28.5 | 43.0 | 46.4 | 60.9 | 57.1 | 14.2 | 28.7 | 71.6 |
| Cr | 2.88 | 12.5 | 25.0 | 50.0 | 43.8 | 68.7 | 55.0 | 10.0 | 35.0 | 80.0 |
| Fe | 2.87 | 12.9 | 24.8 | 50.5 | 43.6 | 69.3 | 54.9 | 9.7 | 35.4 | 80.6 |
| Rb | 5.59 | 42.0 | 61.4 | 22.7 | 71.0 | 13.1 | 76.8 | 53.6 | 30.5 | 7.3 |
| Nb | 3.3 | 1.8 | 34.6 | 30.9 | 50.9 | 47.3 | 60.7 | 21.5 | 17.8 | 57.1 |
| Mo | 3.15 | 2.8 | 31.4 | 37.1 | 48.6 | 54.3 | 58.9 | 17.7 | 23.4 | 64.5 |
| Cs | 6.05 | 46.5 | 64.3 | 28.6 | 73.2 | 19.7 | 78.6 | 57.2 | 35.7 | 14.3 |
| Ba | 5.02 | 35.5 | 57.0 | 14.0 | 67.7 | 3.2 | 74.2 | 48.4 | 22.6 | 3.3 |
| Eu | 4.61 | 29.7 | 53.2 | 6.3 | 64.9 | 5.4 | 71.9 | 43.8 | 15.7 | 12.4 |
| Ta | 3.31 | 2.1 | 34.8 | 30.5 | 51.1 | 46.8 | 60.9 | 21.7 | 17.4 | 56.6 |
| W | 3.16 | 2.5 | 31.7 | 36.7 | 48.7 | 53.8 | 59.0 | 18.0 | 23.0 | 64.0 |

*Fig. 7*